United States Patent [19]
Akerling et al.

[11] Patent Number: 6,055,723
[45] Date of Patent: May 2, 2000

[54] PROCESS OF FABRICATING HIGH FREQUENCY CONNECTIONS TO HIGH TEMPERATURE SUPERCONDUCTOR CIRCUITS

[75] Inventors: Gershon Akerling, Culver City; James M. Murduck, Redondo Beach, both of Calif.

[73] Assignee: TRW Inc., Redondo Beach, Calif.

[21] Appl. No.: 09/088,207

[22] Filed: Jun. 1, 1998

[51] Int. Cl.[7] ............................................. H01R 9/00
[52] U.S. Cl. .............................. 29/843; 29/840; 29/842; 29/846; 29/852; 174/255; 174/256; 174/262
[58] Field of Search .............................. 29/840, 842, 843, 29/846, 847, 852; 174/255, 259, 256, 263, 261, 250, 262

[56] References Cited

U.S. PATENT DOCUMENTS

| | | | |
|---|---|---|---|
| 4,284,659 | 8/1981 | Jaccodine et al. | 427/53.1 |
| 5,055,319 | 10/1991 | Bunshah et al. | 427/38 X |
| 5,564,180 | 10/1996 | Chen et al. | 29/840 |
| 5,706,578 | 1/1998 | Hubner | 29/830 |
| 5,712,192 | 1/1998 | Lewis et al. | 437/182 |
| 5,743,006 | 4/1998 | Beratan | 29/840 |
| 5,758,413 | 6/1998 | Chong et al. | 29/852 |

*Primary Examiner*—Lee Young
*Assistant Examiner*—Binh-An Nguyen
*Attorney, Agent, or Firm*—Michael S. Yatsko; Connie M. Thousand

[57] ABSTRACT

The invention relates to a method for producing an electrical connection to a high temperature superconductor (HTS) circuit, where a polymer material is applied to the HTS surface covering the circuit contact disposed on one surface of the HTS circuit, a via is created in the polymer material exposing the circuit contact, a diffusion barrier is applied into the via covering the circuit contact; and, a solder bump is applied to the diffusion barrier.

6 Claims, 3 Drawing Sheets

PROCESS OF FABRICATING HIGH FREQUENCY CONNECTIONS TO HIGH TEMPERATURE SUPERCONDUCTOR CIRCUITS

BACKGROUND OF THE INVENTION

1. Field of the Invention

The present invention relates to the field of high speed circuits, and more particularly, to a method for producing an electrical connection to a high temperature superconductor (HTS) circuit.

2. Description of the Prior Art

Methods for producing electrical connections to electrical circuits are generally known in the art. Typically, solder bumps have been used to provide electrical connections for various electrical circuits. For this technique, a solder bum is placed on top of an electrical contact disposed on a chip or electrical circuit. The solder bump is then physically joined to another solder bump located on a second circuit to provide electrical connections between the two circuits. This method has been successful when used on chips or circuits which can handle the heat associated with applying a typical solder bump. It has not however been successful with high temperature superconductor (HTS) circuits because the heat associated with the solder bump process damages the HTS circuit.

Heating of the HTS circuit results in the HTS circuit losing oxygen, which oxygen is required for the HTS circuit to be conductive. Applying a solder bump in the typical fashion to an electrical contact on the HTS circuit results in the HTS circuit being heated which results in decreased conductivity of the HTS circuit thereby damaging the HTS circuit.

Since the current method of attaching solder bumps to an electrical circuit can not be used to provide an electrical contact to HTS circuits, wirebonding or pin connections have been used instead. Wirebonding and pin connections do not require elevated temperatures and therefore can provide an electrical connection to HTS circuits without damaging the HTS circuit. Although wirebonding provides a good electrical connection, it has a number of disadvantages. At high frequencies, inductance occurs between the wires which can change the electrical characteristics of the HTS circuit. In addition, wires require a significant amount of space on an HTS circuit.

A method therefore is needed to provide an electrical connection to an HTS circuit that minimizes oxygen loss in the HTS circuit, does not add inductance at high frequencies; and, requires a small amount of volume on the HTS circuit.

SUMMARY OF THE INVENTION

The aforementioned need in the prior art is satisfied by this invention, which provides a method for forming an electrical contact to an HTS circuit. The method comprises the steps of providing a high temperature superconducting (HTS) circuit having a first surface and a circuit contact disposed on the first surface; applying a polymer material to the first surface and over the circuit contact; creating a via in the polymer material exposing the circuit contact; applying an adhesion layer and a diffusion barrier into the via covering the circuit contact; and, applying a solder bump to the diffusion barrier.

DETAILED DESCRIPTION OF THE INVENTION

Figure 2A:
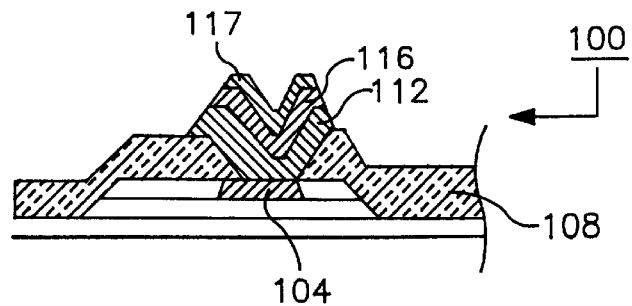
FIGS. 2a–2c are illustrations of the preparation steps required to electrically connect two high temperature superconducter (HTS) circuits in accordance with an alternative embodiment of the invention.
Figure 2B:
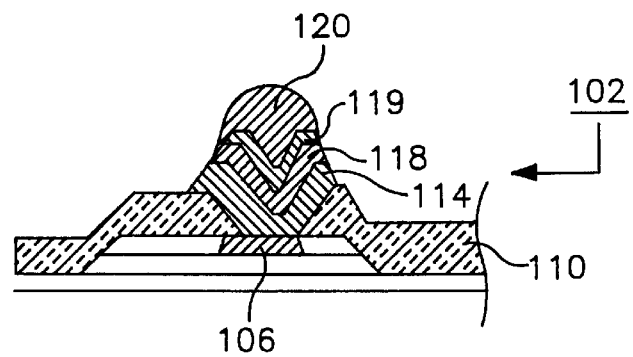
Figure 2C:
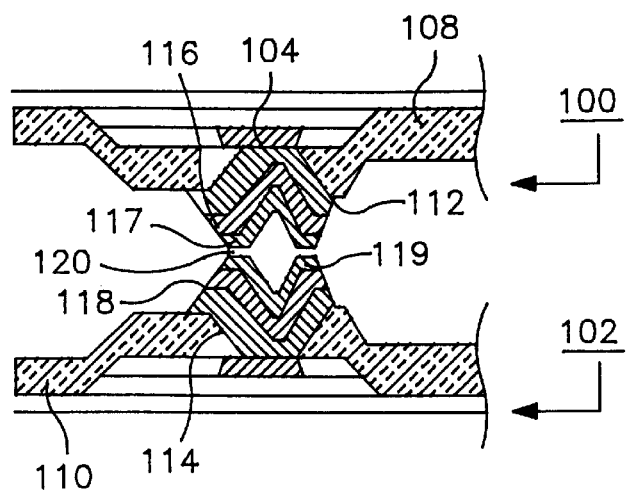
Figure 3:
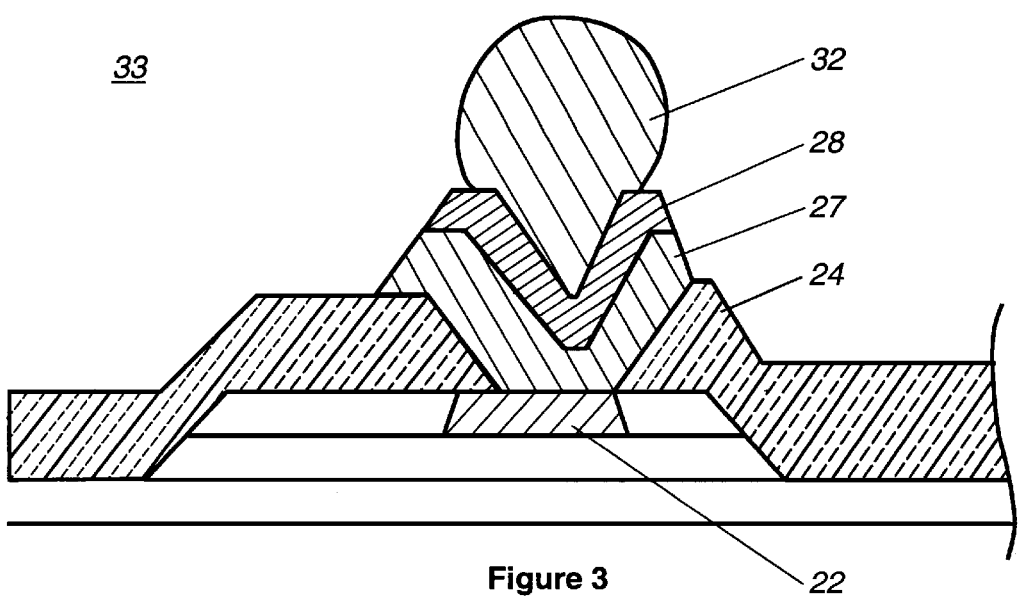
FIG. 3 is an illustration of a high temperature superconductor (HTS) circuit in accordance with a second alternative embodiment of the invention.

The present invention relates to a method for forming an electrical contact to a high temperature superconductor (HTS) circuit and a method for producing a high frequency connection to high temperature superconductor (HTS) circuits. More specifically, the present invention relates to a method for producing an electrical contact and a flip-chip HTS assembly while protecting the HTS circuit from damage caused by heat and loss of oxygen. For illustration, the preferred embodiment of the invention is described and illustrated in FIGS. 1a through 1e. An alternative embodiment of the invention is shown in FIGS. 2a–2c and, a second alternative embodiment of the invention is shown in FIG. 3.

Figure 1A:
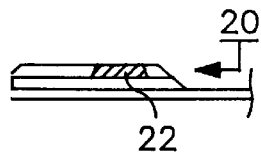
FIGS. 1a–1e are illustrations of the preparation steps used for forming an electrical contact to a high temperature superconductor (HTS) circuit in accordance with the present invention.
Figure 1B:
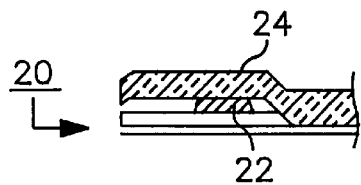

First, as illustrated in FIG. 1a, a high temperature superconductor (HTS) circuit 20 having a circuit contact 22 is provided. As illustrated in FIG. 1b, the next step of the process relates to applying a polymer material 24 over one surface of the HTS circuit 20 and over the circuit contact 22. The polymer material 24 is an insulating material and provides protection from the environment for the HTS circuit 20 during subsequent processing.

Because the HTS circuit 20 requires oxygen to be superconductive, and, heating of the HTS circuit 20 results in a loss of oxygen, it is important to chose a polymer material 24 that can be applied to the HTS circuit 20 using a low temperature. In addition, it is important that the polymer material 24 be such that it can be processed in an oxygen environment. As mentioned above, an HTS circuit 20 requires oxygen to remain superconductive at its operating temperature. Processing the polymer material 24 in a reduced oxygen environment will reduce the oxygen in the HTS circuit 20 resulting in degraded superconductive properties for the HTS circuit 20 which is undesirable.

For the preferred embodiment of the invention, the polymer material 24 is an amorphous flouropolymer material such as amorphous copolymer based on 2,2-bistrifluoromethyl-4,5-difluoro-1,3-dioxole with other fluorine-containing monomers, commonly known as TEFLON AF™, marketed by DuPont DeNemours, located in Wilmington, Del. This material is preferred for its good environmental protection properties and its low processing temperature. For this embodiment of the invention, the amorphous flouropolymer material 24 is applied to the HTS circuit 20 and over the electrical contact 22 in an oxygen environment using an evaporating or spinning-on technique. The amorphous flouropolymer material 24 is a liquid during the covering step, is dried at approximately 100 degrees Celsius to remove the solvent and becomes homogenous upon casting in an oxygen environment.

Although the present invention can be practiced at temperatures in excess of 200 degrees Celsius, it is preferred to process the polymer material at as low of a temperature as possible to minimize degradation of the HTS circuit 20. For the preferred embodiment of the invention a processing temperature of 165 degrees C. is preferred. At this temperature, the amorphous flouropolymer material 24 processes quickly and the loss of oxygen from the HTS circuit 20 is minimized.

Figure 1C:
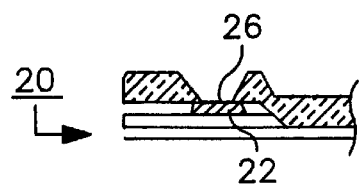

As shown in FIG. 1c, the next step is to create a via 26 in the polymer material 24 to expose the electrical contact 22. The via 26 can be created by reactive ion etching, laser etching or by any means known in the art. For the preferred embodiment of the invention, the via 26 is created using a reactive ion etching process. For the etching process, a masking step is required. The masking step is applied by a photolithographic process which is known by one skilled in the art.

Figure 1D:
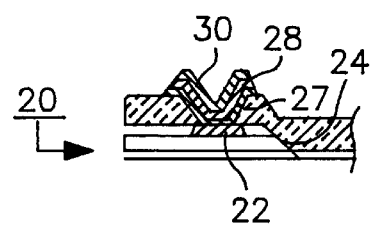

As shown in FIG. 1d, next, an adhesion layer 27 and a diffusion barrier 28 are applied into the via 26 to cover the electrical contact 22. For the preferred embodiment of the invention, titanium is used as the adhesion layer 27 and is applied by sputtering or by any means known in the art.

The diffusion barrier 28 is a conductive material which adheres to the polymer material 24 and the electrical contact 22. For the preferred embodiment of the invention, a palladium material is used as the diffusion barrier 28 and is applied by sputtering or any means known in the art. Since palladium oxidizes over time, for the preferred embodiment of the invention, a protective layer 30, preferably a thin layer of non-oxidizing conductive material such as gold, is used as the protective layer 30 which is applied over the palladium material 28 and protects the palladium material 28 from oxidizing. If a thin layer of non-oxidizing conductive material such as gold is not applied, the palladium 28 may require cleaning before the next step in the process.

Figure 1E:
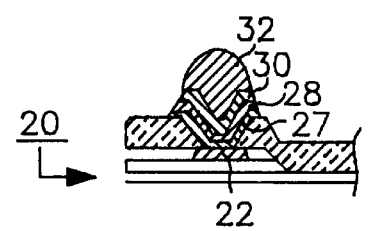

As shown in FIG. 1e, the next step is to apply a solder bump 32 over the diffusion barrier 28 and the thin layer of conductive material 30. The solder bump 32 is applied with as low of a temperature as possible to guard against damage to the HTS circuit 20. The solder bump 32, the diffusion barrier 28, the thin layer of gold 30 and the adhesion layer 27 are all conductive materials; thus, after application of the solder bump 32, a conductive path will exist from the electrical contact 22 through the adhesion layer 27, the diffusion barrier 28 and the gold layer 30 to the solder bump 32 thereby creating an electrical connection between the HTS circuit 20 and a second circuit or chip which is placed in physical contact with the solder bump 32.

As shown in FIG. 3, in accordance with a first embodiment of the invention, the diffusion barrier 28 is not protected by a protective layer and the solder bump 32 is applied directly on the diffusion barrier 28.

The methods detailed above provide electrical connections to HTS circuits 20, 33 while minimizing degradation in the HTS circuits 20, 33 due to heating and the loss of oxygen. The HTS circuits 20, 33 are now ready to be electrically connected to other circuits or chips.

Figure 1F:
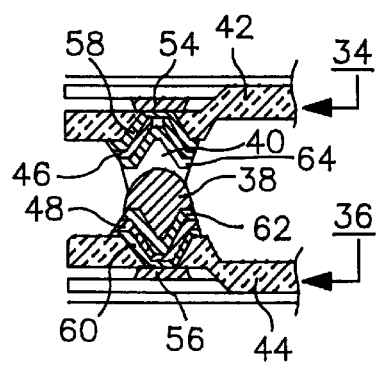
FIG. 1f is an illustration of an additional preparation step required to electrically connect two high temperature superconducter (HTS) circuits prepared according with the steps illustrated in FIGS. 1a–1e.

As shown in FIG. 1f, a first HTS circuit 34, having a first electrical contact 54, a first polymer material 42, a first diffusion barrier 46, a first adhesion layer 58, a first cover layer 64 and a first solder bump 38, is prepared in the manner detailed in FIGS. 1a–1e. A second HTS circuit 36, having a second electrical contact 56, a second polymer material 44, a second diffusion barrier 48, a second adhesion layer 60, a second cover layer 62 and a second solder bump 38, is also prepared in the manner detailed in FIGS. 1a–1e. These HTS circuits 34 and 36 can be electrically connected using a flip-chip process as is practiced by one skilled in the art. To connect two HTS circuits 34 and 36 by a flip-chip method, the first solder bump 38 and the second solder bump 40 are placed in physical contact with each other. Heat is applied to the first 38 and second 40 solder bumps to reflow the solder such that the first 38 and second 40 solder bumps flow together to create a single electrical connection. The solder is then cooled to solidify the electrical connection between the two HTS circuits 34 and 36.

For an alternative embodiment of the invention, shown in FIGS. 2a–2c, a first HTS circuit 100, having a first electrical contact 104, a first polymer material 108, a first adhesion layer 112, and a first diffusion barrier 116 is prepared in the manner previously detailed. And a second HTS circuit 102, having a second electrical contact 106, a second polymer material 110, a second adhesion layer 114, a second diffusion barrier 118, and a solder bump 120 is also prepared in the manner previously detailed. The solder bump 120 is applied to the diffusion barrier in the manner previously described.

The first 100 and second 102 HTS circuits can be electrically connected using a flip-chip process as is practiced by one skilled in the art. To connect these two HTS circuits 100 and 102 by a flip-chip method, the solder bump 120 and the first diffusion barrier 116 are placed in physical contact with each other. Heat is applied to the solder bump 120 to reflow the solder such that the solder flows onto the first diffusion barrier 116. The solder is then cooled to solidify the electrical connection between the two HTS circuits 100 and 102.

For an alternative embodiment of the invention, a first 117 and a second 119 protective layer is applied to the first 116 and second 118 diffusion barriers respectively in the manner previously described. The first 117 and second 119 protective layers are preferably thin layers of gold. The solder bump 120 is applied over the first protective layer 117. The solder bump 120 and the second protective layer 119 are placed in physical contact with each other. Heat is applied to the solder bump 120 to reflow the solder such that the solder flows onto the second protective layer 119. The solder is then cooled to solidify the electrical connection between the two HTS circuits 100 and 102.

Many modifications and variations to the present invention are possible in light of the above teachings. Thus, it is to be understood that, within the scope of the appended claims, the invention may be practiced otherwise than as specifically described above.

We claim as our invention:

1. A method for forming an electrical contact to a high temperature superconductor (HTS) circuit comprising providing a superconductor circuit having a first surface and a circuit contact on said first surface;

applying an amorphous fluoropolymer material such as amorphous copolymer based on 2,2-bistrifluoromethyl-4,5-difluoro-1,3dioxole with other fluorine-containing monomers on said first surface and over said circuit contact to a thickness sufficient to protect said HTS circuit from damage during subsequent processing;

selectively creating a via in said fluoropolymer material exposing said circuit contact;

applying an adhesion layer into said via adhering to said circuit contact;

applying a diffusion barrier into said via adhering to said adhesion layer; and, applying a solder bump to said diffusion barrier in such a fashion as to create an electrically conductive path between said solder bump and said circuit contact.

2. The method as recited in claim 1, further comprises:

processing said amorphous fluoropolymer material in an oxygen environment at a temperature approximately equal to 165 degrees Celsius.

3. The method as recited in claim 1, further comprises processing said fluoropolymer material in an oxygen environment.

4. A method for forming an electrical contact to a high temperature superconductor (HTS) circuit comprising:

provinding a superconductor circuit having a first surface and a circuit contact on said first surface;

applying an amorphous fluoropolymer material such as amorphous copolymer based on 2,2-bistrifluoromethyl-4,5-difluoro-1,3-dioxole with other fluorine-containing monomers over said first surface and over said circuit contact to a thickness sufficient to protect said HTS circuit from damage during subsequent processing;

selectively creating a via in said fluoropolymer material exposing said circuit contact;

applying an adhesion layer into said via covering said circuit contact;

applying a diffusion barrier into said via adhering to said adhesion layer; and, applying a solder bump to said diffusion barrier in such as fashion as to create an electrically conductive path between said solder bump and said circuit contact.

5. The method as recited in claim 4, further comprising processing said fluoropolymer material in an oxygen environment.

6. The method as recited in claim 4, wherein processing said fluoropolymer material comprises processing said fluoropolymer material in an oxygen environment at a temperature of approximately 165 degrees Celsius.

* * * * *